United States Patent
Seth et al.

(10) Patent No.: US 8,742,823 B2
(45) Date of Patent: Jun. 3, 2014

(54) DRIVER OUTPUT PAD LEAKAGE CURRENT COMPENSATION

(75) Inventors: Sumantra Seth, Marathahalli (IN); Jagdish Chand Goyal, Jagadish Nagar OPP. BEML Hospital (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/253,487

(22) Filed: Oct. 5, 2011

(65) Prior Publication Data

US 2013/0088276 A1 Apr. 11, 2013

(51) Int. Cl.
*G06G 7/12* (2006.01)
*H03F 1/30* (2006.01)

(52) U.S. Cl.
CPC .................................... *H03F 1/301* (2013.01)
USPC .......................................................... 327/362

(58) Field of Classification Search
USPC ......................................... 327/362, 538–543
See application file for complete search history.

(56) References Cited

U.S. PATENT DOCUMENTS

| 6,501,327 | B1 * | 12/2002 | Tam ............................... 327/538 |
| 7,212,414 | B2   | 5/2007  | Baarman |
| 7,474,132 | B2 * | 1/2009  | Cheng ............................ 327/108 |
| 7,522,878 | B2   | 4/2009  | Baarman |

* cited by examiner

*Primary Examiner* — Sibin Chen
(74) *Attorney, Agent, or Firm* — Wade J. Brady, III; Frederick J. Telecky, Jr.

(57) ABSTRACT

A device includes a sense circuit configured to detect a leakage current from a driver output pad. A current mirror responds to the sense circuit and compensates for the leakage current detected at the driver output pad. A scaled compensation circuit can supply compensation current to the current mirror.

12 Claims, 2 Drawing Sheets

US 8,742,823 B2

DRIVER OUTPUT PAD LEAKAGE CURRENT COMPENSATION

BACKGROUND

Output pad drivers are often utilized to drive external loads in serial data links. In some cases, such as Universal Serial Bus 2.0 (USB 2.0), when the lanes (a lane is a serial channel associated with an output signal) are not driven strongly by the drivers, the respective lanes may be defined by a weak pull (switch connection) to supply or ground. In such scenarios (usually referred to as HiZ state (high impedance)), driver output leakage/impedance operates as a parameter that determines whether the lane voltage can be defined accurately by a weak driver.

SUMMARY

Driver output pad leakage current compensation is provided.

In one example, a device is provided that includes a sense circuit configured to detect a leakage current from the driver output pad. A current mirror responds to the sense circuit and compensates for the leakage current detected at the driver output pad. A scaled compensation circuit can supply compensation current to the current mirror.

In another example, a method includes detecting a leakage current associated with a driver output pad. The method includes generating a compensation current corresponding to the leakage current associated with the driver output pad and directing the compensation current to the driver output pad to mitigate effects of the leakage current.

In yet another example, an integrated circuit chip is provided. The chip includes a first sense circuit to detect a first leakage current at an output pad when the output pad is pulled to a positive supply rail and a first scaled compensation circuit to generate a first compensation current based on the detected first leakage current. The chip also includes a first current mirror to direct the first compensation current to the output pad to counteract the first leakage current. A second sense circuit is provided to detect a second leakage current at the output pad when the output pad is pulled to a ground rail and a second scaled compensation circuit is provided to generate a second compensation current based on the detected second leakage current. A second current mirror is provided to direct the second compensation current to the output pad to counteract the second leakage current.

DETAILED DESCRIPTION

Figure 1:
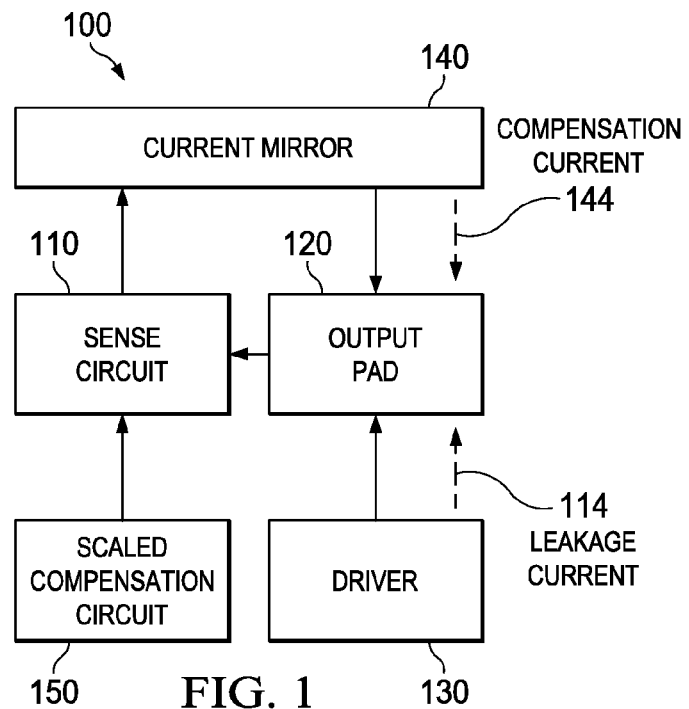
FIG. 1 illustrates an example of a driver output pad leakage current compensation device.

FIG. 1 illustrates an example of a driver output pad leakage current compensation device 100. The device 100 includes a sense circuit 110 to detect a leakage current 114 from a driver output pad 120. Such leakage current 114 is typically generated from a driver 130 when the driver has been placed into a high impedance state and the associated output devices of the driver are tri-stated allowing the driver output pad 120 to be pulled high or low by external components (e.g., components that may be coupled to the pad). A current mirror 140 responds to the sense circuit 110 and compensates for the leakage current 114 detected at the driver output pad 120. As shown in the example of FIG. 1, a compensation current 144 is generated by the current mirror 140 to mitigate (e.g., offset, counteract) the leakage current 114 that is detected by the sense circuit 110. As will be described and illustrated below, the sense circuit 110 can be a current or voltage controlled device such as a transistor (e.g., field effect, junction). The sense circuit 110 that senses or detects the amount of leakage current 114 that is generated by the driver 130 and gates a suitable amount of compensation current 144 to mitigate the leakage current.

A scaled compensation circuit 150 is provided to supply compensation current to the current mirror 140 and to offset the leakage current 114 detected by the sense circuit 110 at the driver output pad 120. The scaled compensation circuit 150 provides a scaled version of output switching devices associated with the driver 130. For example, if the driver output were an NMOS output pair of transistors for example, the scaled compensation circuit 150 would provide a scaled NMOS pair or transistors correlating to the driver's output stage. Similarly, if the driver output were a PMOS pair of transistors, the scaled compensation circuit 150 would provide a scaled PMOS pair of transistors correlating to the driver's output stage. As one example, the driver 130 is push-pull type and includes both PMOS and NMOS output stages. Thus, a separate sense circuit 110, current mirror 140, and scaled compensation circuit 150 can be provided to account for each of the respective output stages such as will be illustrated and described below with respect to the example of FIG. 3.

As used herein, the term NMOS refers to a switching device (metallic oxide semiconductor) having a source and drain associated with N-type material and a gate associated with P-type material. The term PMOS refers to a switching device having a source and drain associated with P-type materials and a gate associated with an N-type material. Various example circuits will be illustrated and described below showing various NMOS and PMOS configurations. Depending on the architecture of the driver 130, however, it is possible that other types of switching devices may be employed for the sense circuit 110, current mirror 140, and/or the scaled compensation circuit 150. For example, NPN or PNP junction transistors could be utilized instead of the NMOS or PMOS examples illustrated and described herein.

It will be appreciated that the device 100 provides a straight-forward and economical implementation for an open-loop leakage sense and correction circuit. As used herein, the device operates in an open-loop manner with respect to the driver 130 that supplies an output voltage or current to the pad 120. Thus, feedback into the driver stage is not required, and hence the device 100 can be added to existing designs without compensation while mitigating complexity of implementation since existing designs are not modified to accommodate the device. The device 100 provides a low power circuit since power consumption only depends on leakage current in the sense/correction circuits. As an example, the device 100 can be configured to consume less than 5% of the overall driver area. Hence, for integrated circuits, an area-efficient solution is provided. The area is limited by minimum sense current required for reliable mirroring. Various advantages are thus realized including compensating leakage accurately when the pad voltage is close to supply or ground which is the application where leakage actually matters for most interfaces. The device 100 provides an easily implementable scheme for existing designs to sense the pad leakage without using any feedback loop into existing driver functionality. As noted, area of the device 100 is small compared to the driver area as a relatively large scaling factor can be applied (only limited by current mirror accuracy).

For purposes of simplification of explanation, in the present example, different components of the device 100 are illustrated and described as performing different functions. However, one of ordinary skill in the art will understand and appreciate that the functions of the described components can be performed by different components, and the functionality of several components can be combined and executed on a single component.

Figure 2:
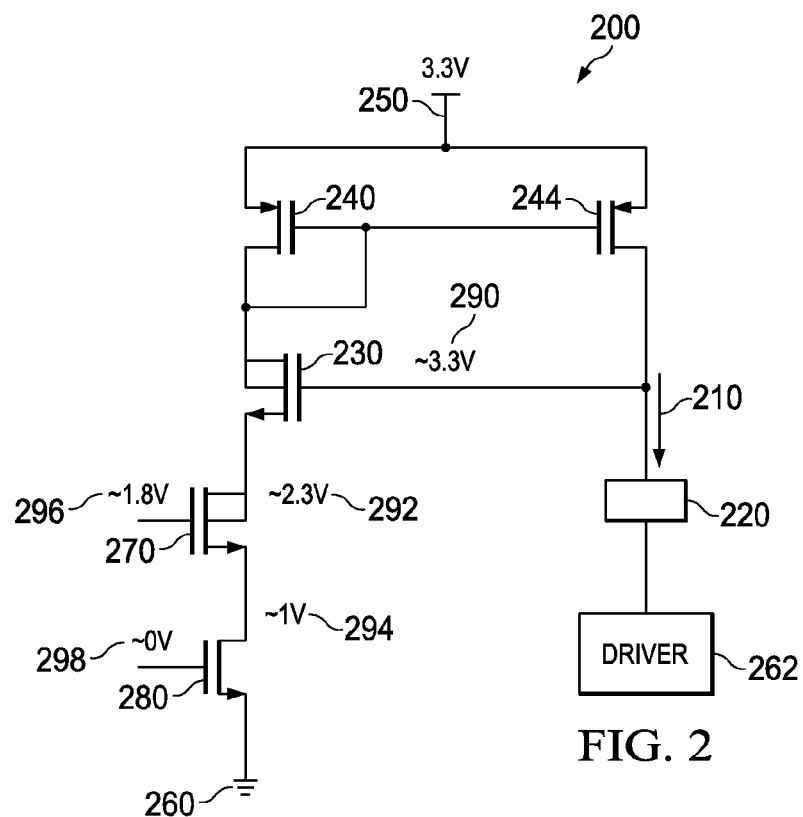
FIG. 2 illustrates an example of a driver output pad leakage current compensation circuit for an NMOS driver output stage.

FIG. 2 illustrates an example of a driver output pad leakage current compensation circuit 200 for an NMOS driver output stage. In general, the circuit 200 generates compensation current 210, including when a driver output pad 220 is pulled to a positive rail during tri-state or high impedance state of the associated driver. As will be shown and described below with respect to FIG. 3, compensation current can be provided over an entire range of operating parameters, including when the output pad 220 is pulled high or low respectively. Leakage from the output pad 220 is sensed by NMOS device 230 and mirrored back to the driver output pad 220 via PMOS devices 240 and 244 configured as a current mirror. Although the circuit 200 is shown in the example of FIG. 2 as 3.3V application having a positive 3.3V rail 250 and a ground rail 260, other voltages are possible as well. Also, as used herein, the ground rail 260 can be connected to a negative supply or other rail that is less than the positive rail. NMOS device 270 and NMOS device 280 are configured as scaled replicas of driver transistors used in the output driver 262 whereas NMOS device 230 is used to sense the pad 220 voltage whose gate is connected to the pad. Example bias voltages are shown at reference numerals 290 (e.g., 3.3V), 292 (e.g., 2.3V), 294 (e.g., 1V), 296 (e.g., 1.8V), and 298 (e.g., 0V), respectively although as noted previously, other applications are possible (e.g., 5V application) than the 3.3V example illustrated by the circuit 200.

The operation of the circuit 200 can be described in terms of an example when the output pad 220 is at a higher voltage; e.g., 2.5-3.3V. The source node of NMOS device 230 in that case can be closer to 1.5-2.3V (Vpad−Vtn), where Vtn is NMOS threshold voltage. NMOS device 270 is typically in saturation/sub-threshold region depending on the leakage current. The source node of device 270 can be at almost constant voltage of about 1.8−Vtn which is ~1V (similar to the output driver's source voltage of which device 270 is a scaled replica). Thus, the leakage current through NMOS devices 270 and 280 will generally be similar as that of the main output driver stage (assuming drain-bulk leakage of the 1.8V drain extended transistor is small). Compensation current 210 is then mirrored through the PMOS current mirror configured from device 240 and device 244 (with similar scaling factor as that of the driver 262 and the scaled NMOS compensation devices 270 and 280) and fed back to the output pad 220 pad. The NMOS device 230 (e.g., operating as a sense circuit) enables accurate cancelation of the leakage of the associated driver transistor. Scaled compensation devices 270 and 280 are thus scaled versions of a driver output stage having two driver NMOS devices. Similar sense and mirror circuits can be used for PMOS sections of the driver 262 as described below with respect to FIG. 3.

Figure 3:
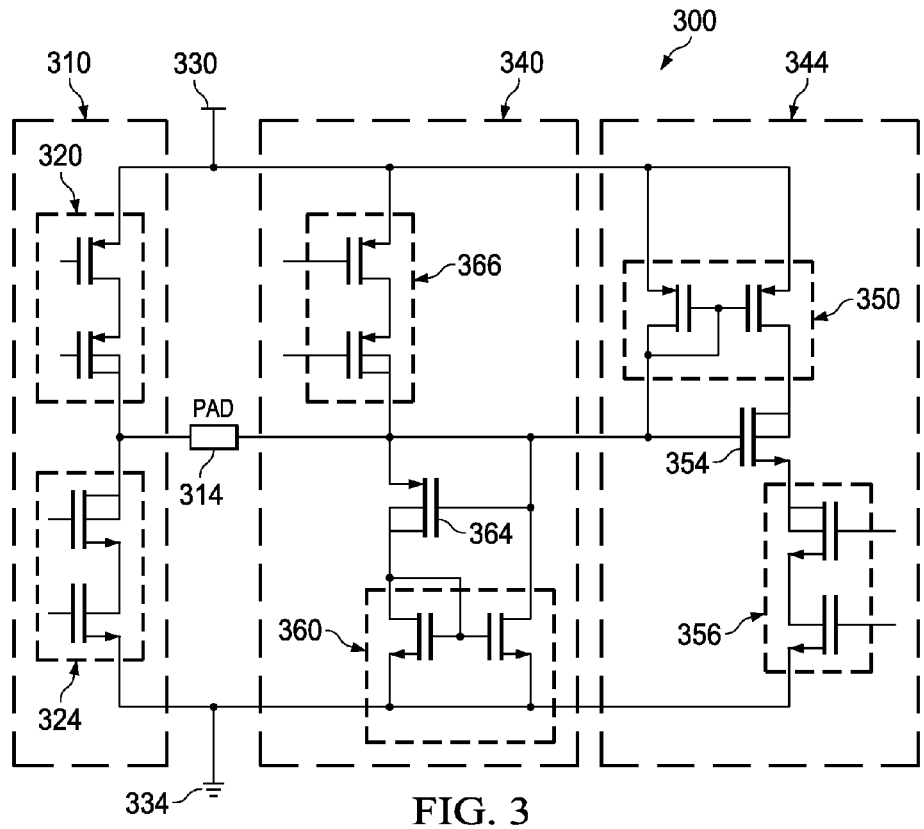
FIG. 3 illustrates an example of an integrated circuit chip that provides driver output pad leakage current compensation for push-pull driver output stages.

FIG. 3 illustrates an example of an integrated circuit chip 300 that provides driver output pad leakage current compensation for push-pull driver output stages. Whereas the circuit described above with respect to FIG. 2 compensated for leakage current of an NMOS driver output stage, the integrated circuit chip 300 provides leakage current compensation for both NMOS and PMOS driver output stages.

A bipolar output stage 310 drives an output pad 314 into a high, low, or high impedance state. The output stage 310 includes a PMOS pair of drivers at 320 and an NMOS pair of drivers 324. As shown, the circuit 300 can be connected to a positive rail 330 and a ground rail (e.g., less than the positive rail) 334. Two leakage compensation circuits 340 and 344 are provided to counteract (e.g., mitigate, offset) leakage current generated by the PMOS drivers 320 or the NMOS drivers 324. Similar to FIG. 2, leakage compensation circuit 344 compensates for leakage in the NMOS driver 324. The leakage current compensation circuit 344 includes a current mirror 350, a sense circuit 354, and NMOS scaled compensation transistors 356 which are scaled versions of the NMOS output driver 324. The scaled compensation circuit 344 operates similarly to that described above with respect to FIG. 2.

When a PMOS driver 320 is employed as driver output to the pad 314, such as can be the case in a driver circuit or output stage, leakage current compensation circuit 340 can be added. Such PMOS driver 320, although configured differently than shown in FIG. 2 to counteract leakage from PMOS drivers instead of NMOS, operates as described according to the general principles described in FIG. 1 which apply to PMOS and/or NMOS output stages alike. Similar to the output leakage compensation circuit 344, the output leakage compensation circuit 340 includes a current mirror 360, a sense circuit 364, and scaled compensation transistors 366 which are scaled versions of the PMOS driver 320. The leakage current compensation circuit 340 counteracts leakage of the PMOS output drivers 320 when the pad 314 is pulled down during tri-state or high impedance conditions of the output stage 310. The leakage current compensation circuit 344 counteracts leakage of the NMOS output driver 324 when the pad 314 is pulled up during tri-state or high impedance conditions of the output stage 310.

The circuit 300 and the circuits previously described can be implemented as part of an integrated circuit chip (IC). Thus, a generic description of the IC could include a first sense circuit 354 to detect a first leakage current at an output pad 314 when the output pad is pulled to a positive supply rail. A first scaled compensation circuit 356 is provided to generate a first compensation current based on the detected first leakage current (e.g., detected by sense circuit 354). A first current mirror 350 is employed to direct the first compensation current to the output pad 314 to counteract the first leakage current. A second sense circuit 364 is provided to detect a second leakage current at the output pad 314 when the output pad is pulled to ground (e.g., a negative supply or other voltage less than the positive rail). A second scaled compensation circuit 366 is employed to generate a second compensation current based on the detected second leakage current. A second current mirror 360 is provided to direct the second compensation current to the output pad 314 to counteract the second leakage current. The integrated circuit could also be provided with a single compensation circuit 340 or 344 if it is determined a priori based on design that the output pad 314 would be pulled up or down during high impedance or tri-state conditions.

Figure 4:
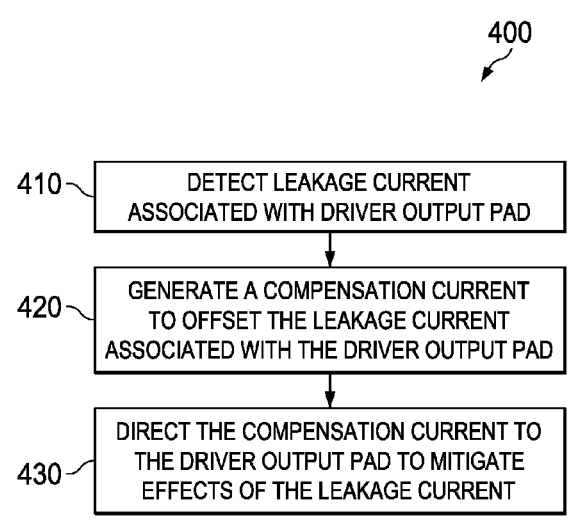
FIG. 4 illustrates an example method for driver output pad leakage current compensation.

In view of the foregoing structural and functional features described above, an example method will be better appreciated with reference to FIG. 4. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various components configured in an IC or a controller, for example.

FIG. 4 illustrates an example method 400 for driver output pad leakage current compensation. Proceeding to 410, the method 400 includes detecting a leakage current associated with a driver output pad. As an example, sense circuitry (e.g., a transistor) could be implemented to sense the leakage current at the driver output pad. At 420, the method 400 includes generating a compensation current to offset the leakage current associated with the driver output pad. As disclosed herein, this can include providing a scaled pair of transistors that is configured to mimic the leakage characteristics of the driver output stage. For instance, if the driver output stage were a pair of NMOS or PMOS drivers, then the scaled compensation circuit would provide a scaled pair of NMOS or PMOS scaling circuits, respectively. At 430, the method 400 includes directing the compensation current to the driver output pad to mitigate effects of the leakage current. This could include utilizing a current mirror to direct the current at the output pad to mitigate leakage current effects. Another aspect of the method 400 includes mitigating leakage current at the pad by compensating for a tri-state output driver including when the driver is pulled to a positive rail. This can also include mitigating leakage current by compensating for a tri-state output driver that is pulled to a ground (e.g., a negative or other voltage less than the positive rail), for example. The method 400 can also include detecting a first leakage current that is generated by pulling the driver output pad to a positive rail or a second leakage current that is generated by pulling the driver output pad to a negative rail and generating a compensation current to counteract the first leakage current or the second leakage current that is detected.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A device, comprising:
   a sense circuit configured to detect a leakage current from a driver output pad; and
   a current mirror configured to respond to the sense circuit and to compensate for the leakage current detected at the driver output pad;
   a scaled compensation circuit configured to supply compensation current to the current mirror and to offset the leakage current detected by the sense circuit at the driver output pad;
   wherein the scaled compensation circuit, the sense circuit, and the current mirror are configured to compensate for an output driver stage that is pulled to a positive rail voltage; and
   wherein the scaled compensation circuit comprises an NMOS pair of transistors that are scaled versions of a driver NMOS output stage.

2. The device of claim 1, wherein the sense circuit comprises an NMOS transistor.

3. The device of claim 1, wherein the current mirror comprises a PMOS transistor pair.

4. A device, comprising:
   a sense circuit configured to detect a leakage current from a driver output pad; and
   a current mirror configured to respond to the sense circuit and to compensate for the leakage current detected at the driver output pad;
   a scaled compensation circuit configured to supply compensation current to the current mirror and to offset the leakage current detected by the sense circuit at the driver output pad;
   wherein the scaled compensation circuit, the sense circuit, and the current mirror are configured to compensate for an output driver stage that is pulled to a ground rail voltage; and
   wherein the scaled compensation circuit comprises a PMOS pair of transistors that are scaled versions of a driver PMOS output stage.

5. The device of claim 4, wherein the sense circuit comprises a PMOS transistor.

6. The device of claim 4, wherein the current mirror comprises an NMOS transistor pair.

7. An integrated circuit chip, comprising:
   a first sense circuit to detect a first leakage current at an output pad when the output pad is pulled to a positive supply rail;
   a first scaled compensation circuit to generate a first compensation current based on the detected first leakage current;
   a first current mirror to direct the first compensation current to the output pad to counteract the first leakage current;
   a second sense circuit to detect a second leakage current at the output pad when the output pad is pulled to a ground rail;
   a second scaled compensation circuit to generate a second compensation current based on the detected second leakage current;
   a second current mirror to direct the second compensation current to the output pad to counteract the second leakage current; and
   the first scaled compensation circuit is an NMOS transistor pair that is scaled according to an NMOS portion of a driver output stage.

8. The integrated circuit chip of claim 7, the second scaled compensation circuit is a PMOS transistor pair that is scaled according to a PMOS portion of a driver output stage.

9. A device, comprising:
   a sense circuit configured to detect a leakage current from a driver output pad;
   a current mirror configured to respond to the sense circuit and to compensate for the leakage current detected at the driver output pad;
   an output driver including first and second transistors having current paths coupled in series between the driver output pad and a first voltage rail; and
   a compensation circuit including third and fourth transistors having current paths coupled in series between said sense circuit and said first voltage rail, wherein said third and fourth transistors are scaled versions of said first and second transistors.

10. The device of claim 9, wherein:
said sense circuit includes a fifth transistor having a gate coupled to the driver output pad and a current path coupled between said current mirror and said compensation circuit.

11. The device of claim 10, wherein:
said current mirror includes sixth and seventh transistors having gates coupled together, said sixth transistor having a current path coupled between a second voltage rail and said driver output pad, said seventh transistor having a current path coupled between said second voltage rail and said current path of said fifth transistor.

12. The device of claim 11, wherein said first voltage rail is at ground and said second voltage rail is at a positive voltage.

\* \* \* \* \*